(12) United States Patent
Diffenderfer

(10) Patent No.: US 7,005,913 B2
(45) Date of Patent: Feb. 28, 2006

(54) I/O BUFFER WITH WIDE RANGE VOLTAGE TRANSLATOR

(75) Inventor: Jan C. Diffenderfer, Escondido, CA (US)

(73) Assignee: ARM Physical IP, Inc., Sunnyvale, CA (US)

( * ) Notice: Subject to any disclaimer, the term of this patent is extended or adjusted under 35 U.S.C. 154(b) by 0 days.

(21) Appl. No.: 10/807,419

(22) Filed: Mar. 22, 2004

(65) Prior Publication Data

US 2005/0068070 A1 Mar. 31, 2005

Related U.S. Application Data

(60) Provisional application No. 60/506,217, filed on Sep. 26, 2003.

(51) Int. Cl.
*G05F 1/10* (2006.01)
(52) U.S. Cl. ..................... 327/546; 327/323
(58) Field of Classification Search ........ 327/108–109, 327/205–206, 312, 316, 319, 323, 328, 332–333, 327/543–546; 326/68, 80–81; 323/315–317
See application file for complete search history.

(56) References Cited

U.S. PATENT DOCUMENTS

| | | | | |
|---|---|---|---|---|
| 6,184,716 B1 * | 2/2001 | Depetro et al. | ............... | 326/83 |
| 6,188,269 B1 * | 2/2001 | Hauser | ...................... | 327/540 |
| 6,288,575 B1 * | 9/2001 | Forbes | ....................... | 327/57 |
| 6,353,350 B1 * | 3/2002 | Bedarida et al. | ............ | 327/291 |
| 6,781,445 B1 * | 8/2004 | Feldman | ...................... | 327/563 |
| 6,801,064 B1 * | 10/2004 | Hunt et al. | ................. | 327/112 |
| 6,836,148 B1 * | 12/2004 | Pullen et al. | ................. | 326/81 |
| 2004/0061525 A1 * | 4/2004 | Tamaki | ....................... | 326/81 |

* cited by examiner

*Primary Examiner*—My-Trang Nu Ton
(74) *Attorney, Agent, or Firm*—Martine Penilla & Gencarella, LLP

(57) ABSTRACT

In accordance with an aspect of an input/output device for providing fast translation between differential signals from a core of an integrated circuit and higher voltage signals that are external to the core, an I/O buffer includes low voltage devices for receiving core input signals, a cascode stage for setting a bias between the input devices and an output stage, and an output stage including a current mirror for providing a translated external output. Another aspect of the invention further includes a feedback path to cut off the current mirror to prevent static current and a keeper device to maintain an output level after cut off of the current mirror.

24 Claims, 2 Drawing Sheets

I/O BUFFER WITH WIDE RANGE VOLTAGE TRANSLATOR

CROSS-REFERENCE TO RELATED APPLICATIONS

This application relates to and claims priority from U.S. Provisional Patent Application Ser. No. 60/506,217, filed Sep. 26, 2003, and is incorporated herein by reference for all purposes.

FIELD OF THE INVENTION

The present invention relates generally to input/output circuits, and more particularly, to buffer circuits capable of fast translation between core and external signals.

BACKGROUND OF THE INVENTION

Conventional I/O buffers can include circuitry (typically in the I/O portion of an integrated circuit) to provide fast translation between core and external signals. Core signals may have lower voltage differential signaling levels, for example between 0 and 1 V, whereas external output signals may have higher voltage signaling, for example ranging between 0 and 3.3 V.

FIG. 1 illustrates a conventional translation scheme in conventional I/O buffer 10. Core differential signals X/XB are provided to gates of transistors N1/N2, respectively. The drains of N1 and N2 are coupled to nodes D and B, respectively. The external signal output OUT is provided from node B in this example. In accordance with the state of the input differential signals X/XB, therefore, either N1 or N2 will turn on, pulling either node D or B toward Vss, respectively. Nodes D and B are further respectively coupled to the gates of P2 and P1. Accordingly, if D is pulled toward Vss (having a value of about 0 V, for example) by action of N1 and signals X/XB, P2 will turn on, pulling node B (and thus external signal OUT) toward Vdd (having a value of about 3.3 V, for example). Conversely, if node B is pulled toward Vss (and thus external signal OUT) by action of N2 and signals X/XB, P1 will turn on, pulling D toward Vdd, and further turning off P2.

One problem with the conventional approach is that transistors with sufficient voltage ratings to tolerate the higher voltage output usually have high threshold voltages. Transistors with low threshold voltage and high breakdown voltage are either not available or are a costly process option. When X/XB are core differential signals having a maximum signaling value of about 1V, N1 and N2 are only driven weakly by signals X/XB because of the threshold voltage being so high. The result is slow responsiveness, which is a problem in, for example, applications where fast translation is desired.

SUMMARY OF THE INVENTION

The present invention relates to a circuit for providing fast translation from differential signals at the lower core voltage to higher voltage signals external to the core. In accordance with an aspect of the invention, an I/O buffer includes low voltage devices for receiving core input signals, a cascode stage for setting a bias between the input devices and an output stage, and an output stage including a current mirror for providing a translated external output. Another aspect of the invention further includes a feedback path to cut off the current mirror to prevent static current and a keeper device to maintain an output level after cut off of the current mirror.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Further, where an embodiment is described with singular components, the invention is not limited thereto, and it should be understood that plural components can be substituted therefor unless expressly stated otherwise herein. Still further, the present invention encompasses present and future known equivalents to the known components referred to herein by way of illustration.

Figure 1:
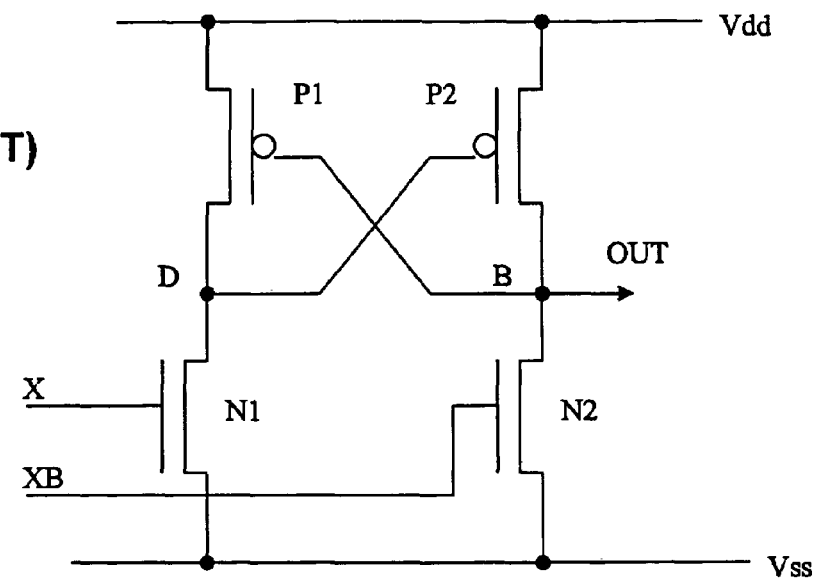
FIG. 1 illustrates a conventional I/O buffer.
Figure 2:
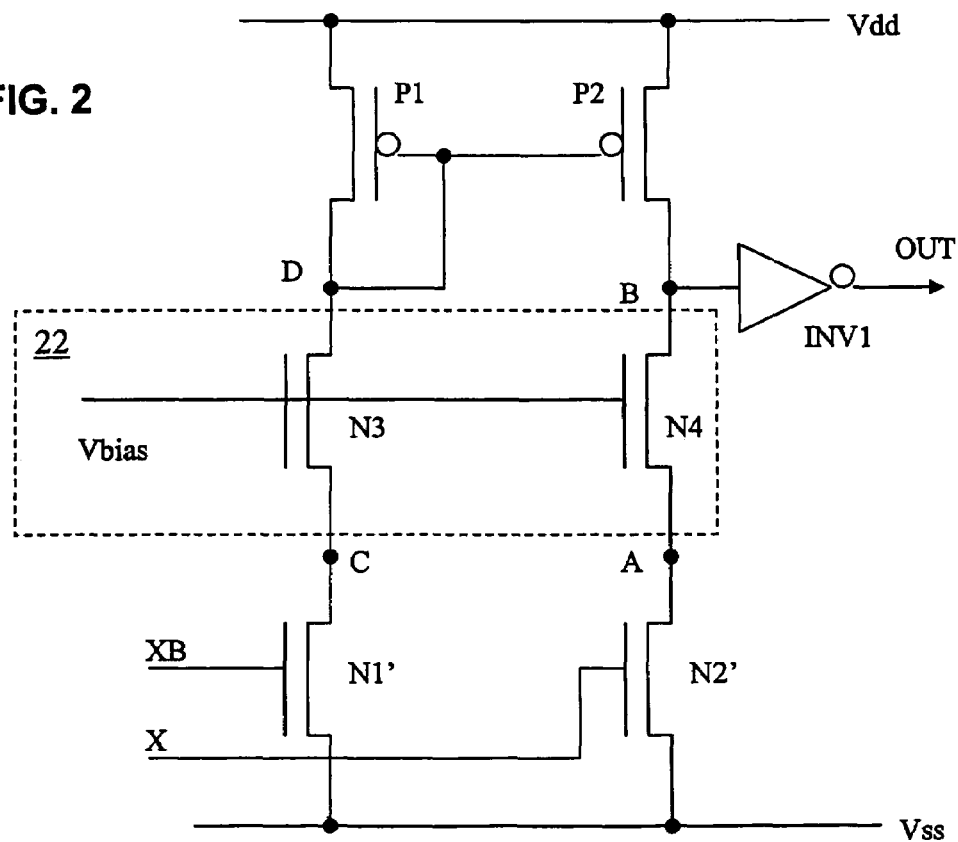
FIG. 2 illustrates an I/O buffer for providing fast translation between input core differential signals and an external output signal according to the present invention.

An example implementation of a fast translation I/O buffer 20 in accordance with the present invention is illustrated in FIG. 2. As shown in FIG. 2, N1 and N2 have been replaced with N1' and N2' which are low-voltage devices capable of responding faster to changes in low-voltage core differential signals X/XB. The problem of the commonly available lower threshold core devices having too low of a breakdown voltage tolerance is addressed by transistors N3 and N4 (comprising cascode stage 22), which protect the drains of N1' and N2' from overvoltage. As further shown in this illustrative example, N3 is coupled between the sources of N1' and P1 at node C and transistor N4 is coupled between the sources of N2' and P2 at node A. Transistors N3 and N4 have threshold voltages similar to transistors P1 and P2, in accordance with the desired external signaling voltage levels of OUT. The gates of transistors N3 and N4 are coupled to a bias voltage Vbias which is sufficiently high to overcome the higher threshold voltages of these devices.

As further shown in FIG. 2, in the output stage current mirror comprised of transistors P1 and P2, the gate of P1 is further coupled to node D. As is still further shown in this example, the output stage is further comprised of driver INV1 which is coupled to node B between P2 and N4 and provides external signal OUT.

In operation, depending on the differential state of X/XB, either transistor N1' or N2' will more reliably and responsively pull either node C or A, respectively, toward Vss.

Because N3 and N4 are supplied the same bias voltage at their gates, the node pulled more toward Vss will cause the respective transistor N3 or N4 to be turned on, pulling either node D or B, respectively, more toward Vss. This causes either P1 or P2 to pull the other node toward Vdd.

For example, where X/XB is high/low, for example 1V/0V, respectively, node A is pulled toward Vss by N2' turning on, causing the voltage difference between Vbias and node A to exceed the threshold voltage of N4. Meanwhile, N1' turns off, keeping the voltage at node C too close to Vbias and preventing N3 from turning on. Because N4 turns on, however, node B is pulled toward Vss, which is inverted by INV1, and so external signal OUT is driven high. Meanwhile, transistor P2, having its gate coupled to node D, stays off because N3 stays off by action of N1' and the bias voltage supplied to the gate of N3.

Conversely, where X/XB is low/high, respectively, node C is pulled toward Vss by N1' turning on, causing the voltage difference between Vbias and node C to exceed the threshold voltage of N3. Meanwhile, N2' turns off, keeping the voltage at node A too close to Vbias and preventing N4 from turning on. Because N3 turns on, however, node D is pulled toward Vss. Meanwhile, transistor P2, having its gate coupled to node D, turns on, pulling node B toward Vdd, which is inverted by INV1, and so external signal OUT is driven low. Meanwhile, N4 stays off by action of N2' and the bias voltage supplied to the gate of N4.

By virtue of the present invention, therefore, including the lower voltage devices N1' and N2', and biased devices N3 and N4, the buffer 20 of FIG. 2 is able to provide faster and more reliable translation between core and external signals.

Although the buffer 20 in FIG. 2 provides advantages over the prior art, certain issues remain. For example, in a differential input state where XB is high and X is low, N1 and N3 turn on, causing node D to be pulled toward Vss and P1 and P2 to conduct. But, as P1 conducts, node D is also pulled toward Vdd, causing excessive current and power to be consumed.

Figure 3:
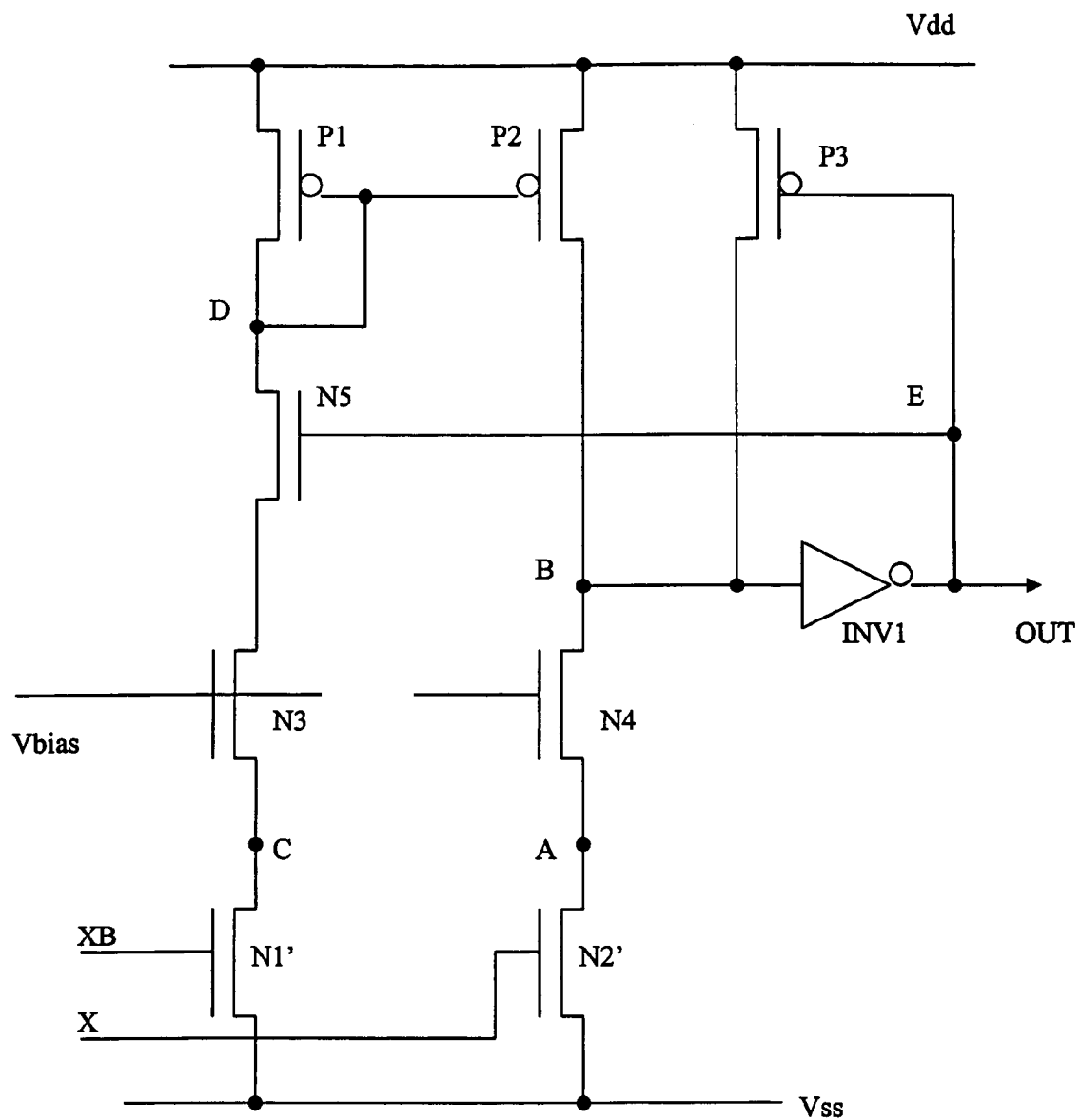
FIG. 3 illustrates another embodiment of an I/O buffer in accordance with the present invention.

Another embodiment of the invention is illustrated in FIG. 3. As shown in FIG. 3, this embodiment of the invention further includes a feedback transistor N5 coupled between transistor N3 and node D, and keeper transistor P3, having its source coupled to node B and its gate coupled to the output OUT. The gate of N5 is also coupled to the output OUT.

By virtue of this arrangement, for example, in the input differential signaling state when X is low and XB is high, node C is driven toward Vss, causing N3 to turn on. Meanwhile, if the output OUT was previously in the high state (opposite of what needs to be signaled now), N5 will be turned on, and node D will be pulled low, causing P2 to conduct and pull node B toward Vdd. This will cause the output signal OUT to be driven low as desired, thus driving node E low. This situation causes P3 to turn on, keeping node B pulled toward Vdd and shutting off N5, thus removing the path of static current in the XB signal path, which static current was a problem in the previous embodiment.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims include such changes and modifications.

What is claimed is:

1. An input/output signaling apparatus, comprising:
   a low voltage input stage that receives low voltage core input signals;
   an output stage that provides a higher voltage external output based on the low voltage core input signals;
   a cascode stage coupled between the low voltage input stage and the output stage that provides a bias to the output stage and provides a limit for preventing breakdown in the low voltage input stage;
   a feedback device coupled to the output stage that prevents static current after a change in value of the external output; and
   a keeper device that maintains the changed value of the external output based on operation of the feedback device.

2. The input/output signaling apparatus of claim 1, wherein a range of the low voltage core input signals is limited to between approximately 0 volt and 1 volt.

3. The input/output signaling apparatus of claim 1, wherein a range of the higher voltage external output can exceed a range of the low voltage core input signals by a factor of approximately three.

4. The input/output signaling apparatus of claim 2, wherein a range of the higher voltage external output can exceed the range of the low voltage core input signals by a factor of approximately three.

5. The input/output signaling apparatus of claim 4, wherein the range of the higher voltage external output is between approximately 0 volt and 3.3 volts.

6. The input/output signaling apparatus of claim 5, wherein the low voltage input stage is comprised of a pair of low-voltage transistors having gates respectively coupled to a pair of differential signals corresponding to the low voltage core input signals.

7. The input/output signaling apparatus of claim 5, wherein the output stage is a current mirror comprised of a pair of transistors having threshold voltages in accordance with the higher voltage external output.

8. The input/output signaling apparatus of claim 7, wherein the cascade stage is comprised of a pair of transistors having threshold voltages approximately the same as the threshold voltages of the current mirror transistors.

9. The input/output signaling apparatus of claim 5, wherein the low voltage input stage is comprised of a first pair of low-voltage transistors having gates respectively coupled to a pair of differential signals corresponding to the low voltage core input signals, and
   wherein the output stage is a current mirror comprised of a second pair of transistors having threshold voltages in accordance with the higher voltage external output, and
   wherein the cascade stage is comprised of a third pair of transistors having threshold voltages approximately the same as the threshold voltages of the current mirror transistors.

10. The input/output signaling apparatus of claim 1, wherein the low voltage input stage is comprised of a pair of low-voltage transistors having gates respectively coupled to a pair of differential signals corresponding to the low voltage core input signals.

11. The input/output signaling apparatus of claim 1, wherein the output stage is a current mirror comprised of a pair of transistors having threshold voltages in accordance with the higher voltage external output.

12. The input/output signaling apparatus of claim 11, wherein the cascade stage is comprised of a pair of transistors having threshold voltages approximately the same as the threshold voltages of the current mirror transistors.

13. The input/output signaling apparatus of claim 1, wherein the low voltage input stage is comprised of a first pair of low-voltage transistors having gates respectively coupled to a pair of differential signals corresponding to the low voltage core input signals, and wherein the output stage is a current minor comprised of a second pair of transistors having threshold voltages in accordance with the higher voltage external output, and wherein the cascade stage is comprised of a third pair of transistors having threshold voltages approximately the same as the threshold voltages of the current mirror transistors.

14. An input/output signaling apparatus, comprising:
a low voltage input stage that receives low voltage core input signals;
an output stage that provides a higher voltage external output based on the low voltage core input signals;
a cascode stage coupled between the low voltage input stage and the output stage that provides a bias to the output stage;
a feedback device coupled to the output stage; and
a keeper device that maintains a changed value of the external output based on operation of the feedback device.

15. The input/ output signaling apparatus of claim 14, wherein a range of the low voltage core input signals is limited to between approximately 0 volt and 1 volt.

16. The input/output signaling apparatus of claim 15, wherein a range of the higher voltage external output can exceed the range of the low voltage core input signals by a factor of approximately three.

17. The input/output signaling apparatus of claim 16, wherein the range of the higher voltage external output is between approximately 0 volt and 3.3 volts.

18. The input/output signaling apparatus of claim 14, wherein a range of the higher voltage external output can exceed a range of the low voltage core input signals by a factor of approximately three.

19. The input/output signaling apparatus of claim 14, wherein the bias provided to the output stage provides a limit for preventing breakdown in the low voltage input stage.

20. The input/ output signaling apparatus of claim 14, wherein the feedback device prevents static current after a change in value of the external output.

21. A method for input/output signaling, the method comprising the steps of:
receiving low voltage core input signals;
providing a higher voltage external output based on the low voltage core input signals;
providing a bias to the external output;
providing a feedback signal, the feedback signal relating to a change in value of the external output; and
maintaining the changed value of the external output based on the feedback signal.

22. The method of claim 21, wherein a range of the low voltage core input signals is limited to between approximately 0 volt and 1 volt and the range of the higher voltage external output is between approximately 0 volt and 3.3 volts.

23. The method of claim 21, wherein the bias provides a limit for preventing breakdown in the step of receiving the low voltage core input signals.

24. The method of claim 21, wherein the feedback signal prevents static current after the changed value of the external output.

* * * * *